United States Patent
Lai et al.

(10) Patent No.: US 11,024,753 B2
(45) Date of Patent: Jun. 1, 2021

(54) PERC SOLAR CELL CAPABLE OF IMPROVING PHOTOELECTRIC CONVERSION EFFICIENCY AND PREPARATION METHOD THEREOF

(71) Applicants: Guangdong Aiko Solar Energy Technology Co., Ltd., Guangdong (CN); Zhejiang Aiko Solar Energy Technology Co., Ltd., Yiwu (CN)

(72) Inventors: Chun-Wen Lai, Foshan (CN); Jiebin Fang, Foshan (CN); Gang Chen, Foshan (CN)

(73) Assignees: Guangdong Aiko Solar Energy Technology Co., Ltd., Guangdong (CN); Zhejiang Aiko Solar Energy Technology Co., Ltd., Yiwu (CN)

( * ) Notice: Subject to any disclaimer, the term of this patent is extended or adjusted under 35 U.S.C. 154(b) by 0 days.

(21) Appl. No.: 16/490,862

(22) PCT Filed: Jun. 24, 2017

(86) PCT No.: PCT/CN2017/089884
§ 371 (c)(1),
(2) Date: Sep. 3, 2019

(87) PCT Pub. No.: WO2018/157521
PCT Pub. Date: Sep. 7, 2018

(65) Prior Publication Data
US 2020/0075782 A1 Mar. 5, 2020

(30) Foreign Application Priority Data
Mar. 3, 2017 (CN) .......................... 201710122715.8

(51) Int. Cl.
*H01L 31/02* (2006.01)
*H01L 31/0216* (2014.01)
(Continued)

(52) U.S. Cl.
CPC .... *H01L 31/02167* (2013.01); *H01L 21/0209* (2013.01); *H01L 21/0217* (2013.01);
(Continued)

(58) Field of Classification Search
None
See application file for complete search history.

(56) References Cited

U.S. PATENT DOCUMENTS

| 4,971,633 A | 11/1990 | Beavis et al. |
| 2009/0211628 A1* | 8/2009 | Engelhart ....... H01L 31/022458 136/256 |

(Continued)

FOREIGN PATENT DOCUMENTS

| CN | 102800745 A | 11/2012 |
| CN | 103022262 A | 4/2013 |

(Continued)

OTHER PUBLICATIONS

International Search Report, dated Dec. 6, 2017, for International Application No. PCT/CN2017/089884, 6 pages. (with English translation).

*Primary Examiner* — Benjamin P Sandvik
(74) *Attorney, Agent, or Firm* — Seep IP Law Group LLP

(57) ABSTRACT

A PERC solar cell capable of improving photoelectric conversion efficiency and a preparation method thereof are provided. The solar cell consecutively includes, from the bottom up, a rear silver electrode (1), a rear aluminum field (2), a rear silicon nitride film (3), a rear aluminum oxide film (4), P-type silicon (5), N-type silicon (6), a front silicon nitride film (7), and a front silver electrode (8). The rear aluminum field (2) is connected to the P-type silicon (5) via a rear aluminum strip (10). The P-type silicon (5) is a silicon wafer of the cell. The N-type silicon (6) is an N-type emitter formed by diffusion via the front surface of the silicon wafer. The front silicon nitride film (7) is deposited on the front (Continued)

surface of the silicon wafer. The rear aluminum oxide film (4) is deposited on the rear surface of the silicon wafer. The rear aluminum oxide film (3) is deposited after the front silicon nitride film (7) is deposited on the silicon wafer, and the rear surface of the silicon wafer is washed before depositing the rear aluminum oxide film (3). The cell can significantly improves passivation effect of the rear aluminum oxide film and improve the open-circuit voltage and short-circuit current of the cell, thereby increasing photoelectric conversion efficiency of the cell.

3 Claims, 2 Drawing Sheets

(51) Int. Cl.
    *H01L 21/02*     (2006.01)
    *H01L 31/0224*     (2006.01)
    *H01L 31/0236*     (2006.01)
    *H01L 21/04*     (2006.01)
    *H01L 31/18*     (2006.01)

(52) U.S. Cl.
    CPC .. *H01L 21/02082* (2013.01); *H01L 21/02172* (2013.01); *H01L 21/02299* (2013.01); *H01L 21/041* (2013.01); *H01L 31/0236* (2013.01); *H01L 31/022441* (2013.01); *H01L 31/1868* (2013.01); *H01L 31/1804* (2013.01)

(56) References Cited

U.S. PATENT DOCUMENTS

| | | | |
|---|---|---|---|
| 2013/0183796 A1* | 7/2013 | Stewart | H01L 31/068 438/98 |
| 2014/0065757 A1* | 3/2014 | Yi | H01L 31/02167 438/71 |
| 2015/0007881 A1* | 1/2015 | Khadilkar | C03C 8/10 136/256 |
| 2020/0052149 A1* | 2/2020 | Ito | H01L 31/0682 |

FOREIGN PATENT DOCUMENTS

| | | |
|---|---|---|
| CN | 103746040 A | 4/2014 |
| CN | 106206757 A | 12/2016 |
| CN | 106876495 A | 6/2017 |
| JP | 2012/150669 A1 | 11/2012 |
| JP | 2014-241348 A | 12/2014 |
| JP | 2016-122749 A | 7/2016 |
| JP | 2016-523452 A | 8/2016 |
| JP | 2016-197651 A | 11/2016 |
| KR | 10-2011-0034931 A | 4/2011 |
| KR | 10-2012-0051974 A | 5/2012 |
| KR | 10-2014-0029563 A | 3/2014 |
| KR | 10-2016-0004951 A | 1/2016 |
| WO | 2013/109466 A1 | 7/2013 |

* cited by examiner

PERC SOLAR CELL CAPABLE OF IMPROVING PHOTOELECTRIC CONVERSION EFFICIENCY AND PREPARATION METHOD THEREOF

FIELD OF THE INVENTION

The present invention relates to the field of solar cells, and in particular to a PERC solar cell capable of improving photoelectric conversion efficiency and a preparation method thereof.

BACKGROUND OF THE INVENTION

A crystalline silicon solar cell is a device that effectively absorbs solar radiation energy and converts light energy into electrical energy through the photovoltaic effect. When sunlight reaches the p-n junction of a semiconductor, new electron-hole pairs are generated. Under the action of the electric field of the p-n junction, the holes flow from the N zone to the P zone, and the electrons flow from the P zone to the N zone, generating current upon switching on a circuit.

In a conventional crystalline silicon solar cell, surface passivation is basically only performed at the front surface, which involves depositing a layer of silicon nitride on the front surface of the silicon wafer via PECVD to reduce the recombination rate of the minority carriers at the front surface. As a result, the open-circuit voltage and short-circuit current of the crystalline silicon cell can be greatly increased, which leads to an increase of the photoelectric conversion efficiency of the crystalline silicon solar cell.

In order to meet the ever-rising requirements for the photoelectric conversion efficiency of crystalline silicon cells, people began to research the rear surface passivation techniques for solar cells.

SUMMARY OF THE INVENTION

One of objectives of the present invention is to provide a PERC solar cell capable of improving photoelectric conversion efficiency, which can significantly improve passivation effect of the rear aluminum oxide film, reduce pollution to the cell and improve the open-circuit voltage and short-circuit current of the cell, thereby improving the photoelectric conversion efficiency of the cell.

The object of the present invention is implemented by the following technical solution. A PERC solar cell capable of improving photoelectric conversion efficiency comprises consecutively, from the bottom up, a rear silver electrode, a rear aluminum field, a rear silicon nitride film, a rear aluminum oxide film, P-type silicon, N-type silicon, a front silicon nitride film, and a front silver electrode; wherein a rear surface of the solar cell is further provided with a plurality of laser grooving regions running through the rear silicon nitride film and the rear aluminum oxide film to the P-type silicon, the plurality of laser grooving regions are arranged in parallel, each of the laser grooving regions is filled with a rear aluminum strip, and the rear aluminum strip and the rear aluminum field are molded in an integral printing manner with aluminum paste, wherein the rear aluminum field is connected to the P-type silicon via the rear aluminum strip, wherein the rear silver electrode, the rear aluminum field, the rear silicon nitride film, the rear aluminum oxide film, the P-type silicon, the N-type silicon, the front silicon nitride film and the front silver electrode are sequentially connected from the bottom up, the P-type silicon is a silicon wafer of the cell, the N-type silicon is an N-type emitter formed by diffusion via a front surface of the silicon wafer, the front silicon nitride film is deposited on the front surface of the silicon wafer, the rear aluminum oxide film is deposited on the rear surface of the silicon wafer, the rear aluminum oxide film is deposited after the front silicon nitride film is deposited on the silicon wafer, and the rear surface of the silicon wafer is washed before depositing the rear aluminum oxide film.

In the solar cell of the present invention, the rear surface of the silicon wafer is washed before depositing the rear aluminum oxide film, to remove an oxide layer and dirt on the rear surface of the silicon wafer, which reduces pollution to the cell and facilitates deposition of the rear aluminum oxide film. The cell can significantly improve passivation effect of the rear aluminum oxide film and improve the open-circuit voltage and short-circuit current of the cell, thereby greatly increasing photoelectric conversion efficiency of the cell.

As a preferred embodiment, in the present invention, the thickness of the front silicon nitride film is 50 to 300 μm, preferably 60 to 90 μm.

The thickness of the rear silicon nitride film is 80 to 300 μm, preferably 100 to 200 μm.

The thickness of the rear aluminum oxide film is 2 to 50 nm, preferably 5 to 30 nm.

Another objective of the present invention is to provide a method of preparing the PERC solar cell capable of improving photoelectric conversion efficiency described above.

The object of the present invention is implemented by the following technical solution. The method of preparing the PERC solar cell capable of improving photoelectric conversion efficiency described above comprises the following steps:

S101: forming a textured surface at a front surface of a silicon wafer, the silicon wafer being a P-type silicon;

S102: performing diffusion via the front surface of the silicon wafer to form N-type silicon, i.e., an N-type emitter;

S103: removing p-n junctions at periphery of the silicon wafer and front phosphosilicate glass formed during diffusion, and performing an ozone oxidation treatment on the front surface of the silicon wafer;

S104: depositing a front silicon nitride film on the front surface of the silicon wafer;

S105: washing a rear surface of the silicon wafer;

S106: depositing a rear aluminum oxide film on the rear surface of the silicon wafer;

S107: depositing a rear silicon nitride film on the rear surface of the silicon wafer;

S108: performing laser grooving in the rear surface of the silicon wafer, through the rear silicon nitride film and the rear aluminum oxide film and then to the silicon wafer, to form a plurality of laser grooving regions;

S109: printing rear electrode paste on the rear surface of the silicon wafer, and baking the silicon wafer;

S110: printing aluminum paste on the rear surface of the silicon wafer to form an rear aluminum field; printing aluminum paste in the laser grooving regions to form rear aluminum strips while printing the rear aluminum field, wherein rear aluminum strips and the rear aluminum field are molded in an integral printing manner; and baking the silicon wafer after printing;

S111: printing positive electrode paste on the front surface of the silicon wafer, and baking the silicon wafer;

S112: sintering the silicon wafer at a high temperature to form a rear silver electrode, the rear aluminum field and a front silver electrode;

S113: performing an anti-LID annealing treatment on the silicon wafer to form the solar cell.

In the present invention, after the step S103, it is determined whether or not to polish the rear surface of the silicon wafer according to actual conditions. If polishing is not performed after the step S103 to the rear surface, in the washing step of S105 of the present invention, the concentration of KOH or NAOH and the washing time may be adjusted as needed to achieve the function of polishing the rear surface.

The steps S101-S108 in the present invention are not necessarily performed sequentially in order, and those skilled in the art may adjust the order of the steps according to actual conditions.

In the present invention, the step S105 of washing the rear surface of the silicon wafer includes specifically the following steps performed sequentially:

S1051: placing the silicon wafer into a mixed solution of KOH and $H_2O_2$ for a period of 30~300 s, wherein the mass fraction of KOH in the mixed solution is 0.1%~6%, the mass fraction of $H_2O_2$ in the mixed solution is 0.1%~5%, and the temperature of the mixed solution is 60~99 degree centigrade;

S1052: rinsing the silicon wafer in deionized water for a period of 30~300 s;

S1053: placing the silicon wafer into a KOH solution for a period of 30~300 s, wherein the mass fraction of KOH is 0.3%~18%, and the temperature is 60~99 degree centigrade;

S1054: placing the silicon wafer into a mixed solution of KOH and $H_2O_2$ for a period of 30~300 s, wherein the mass fraction of KOH in the mixed solution is 01%~6%, the mass fraction of $H_2O_2$ in the mixed solution is 0.1%~5%, and the temperature of the mixed solution is 60~99 degree centigrade;

S1055: rinsing the silicon wafer in deionized water for a period of 30~300 s;

S1056: placing the silicon wafer into an HF solution or an HCL solution or a mixed solution of HF and HCL at a temperature of 60~90 degree centigrade for a period of 5~300 s, wherein the mass fraction of HF in the HF solution is 0.2%~6%, the mass fraction of HCL in the HCL solution is 0.2%~5%, and in the mixed solution of HF and HCL, the mass fraction of HF is 0.2%~6% and the mass fraction of HCL is 0.2%~5%;

S1057: rinsing the silicon wafer in deionized water at a temperature of 60~99 degree centigrade for a period of 30~300 s, wherein after the rinsing is completed, the silicon wafer is pulled out of the water;

S1058: baking the silicon wafer.

The purpose of the above steps S1051 and S1054 is to wash the organic impurities of the silicon wafer or by-products from the reactions with the alkali adhered to the silicon wafer. The purpose of the step S1053 is to etch the rear surface of the silicon wafer.

Wherein all of KOH in the step S105 can be replaced with NAOH.

The acid solution in the step S1056 is to neutralize the residual alkali solution brought from the previous steps on the silicon wafer, to remove metal ions and remove an oxide layer on the rear surface of the silicon wafer.

In the step S1057, after the rinsing is completed, the silicon wafer is pulled out of the water with a slow pulling technique. That is, after being immersed in the hot deionized water, the silicon wafer is slowly pulled out of the water, serving to a hydrophobic property of the silicon wafer.

In the preparation method of the present invention, after depositing a front silicon nitride film on the front surface, the rear surface of the silicon wafer is washed, and then the silicon wafer is taken out to deposit a rear aluminum oxide film on the rear surface. Washing the rear surface can remove the oxide layer and dirt at the rear surface of the silicon wafer, reduce pollution to the cell and facilitate deposition of the rear aluminum oxide film, and therefore passivation effect of the rear aluminum oxide film can be significantly improved and the open-circuit voltage and short-circuit current of the cell can be improved, thereby greatly increasing photoelectric conversion efficiency of the cell. Moreover, the input cost for equipment is low, the processes are simple and the compatibility with the current production line is well.

BRIEF DESCRIPTION OF THE DRAWINGS

The present invention is further detailed below in combination with the drawings and specific embodiments.

Figure 1:
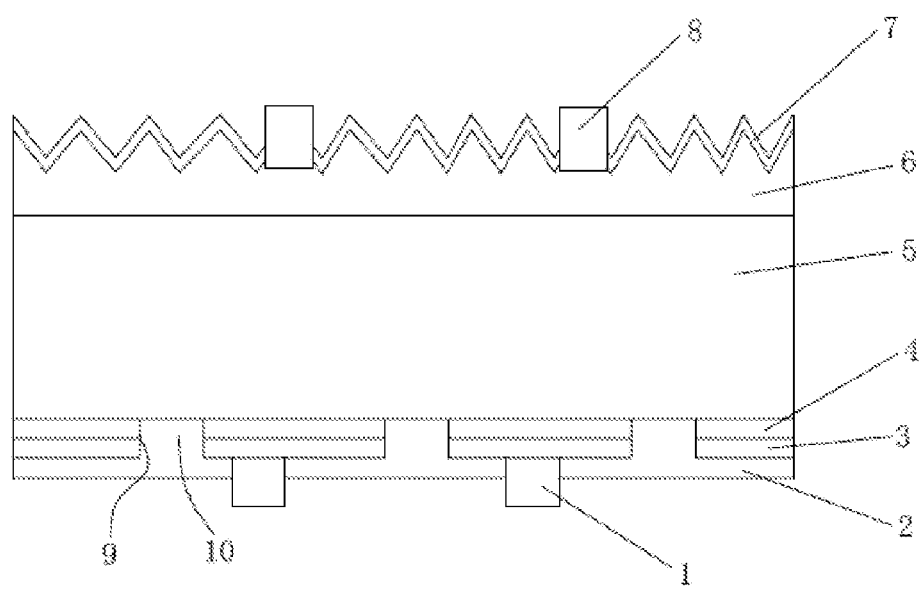
FIG. 1 is a sectional view of an overall structure of a PERC solar cell capable of improving photoelectric conversion efficiency in the present invention.

DESCRIPTION OF REFERENCE NUMERALS 1. rear silver electrode, 2. rear aluminum field, 3. rear silicon nitride film, 4. rear aluminum oxide film, 5. P-type silicon, 6. N-type silicon, 7. front silicon nitride film, 8. front silver electrode, 9. laser grooving region; 10. rear aluminum strip.

DETAILED DESCRIPTION OF THE ILLUSTRATED EMBODIMENTS

Embodiment 1

As shown in FIG. 1, a PERC solar cell capable of improving photoelectric conversion efficiency includes consecutively, from the bottom up, a rear silver electrode 1, a rear aluminum field 2, a rear silicon nitride film 3, a rear aluminum oxide film 4, P-type silicon 5, N-type silicon 6, a front silicon nitride film 7, and a front silver electrode 8. The rear surface of the solar cell is further provided with a plurality of laser grooving regions 9 running through the rear silicon nitride film 3 and the rear aluminum oxide film 4 to the P-type silicon 5. The plurality of laser grooving regions 9 are arranged in parallel. Each of the laser grooving regions 9 is filled with a rear aluminum strip 10, and the rear aluminum strip 10 and the rear aluminum field 2 are molded in an integral printing manner with aluminum paste. The rear aluminum field 2 is connected to the P-type silicon 5 via the rear aluminum strip 10. The rear silver electrode 1, the rear aluminum field 2, the rear silicon nitride film 3, the rear aluminum oxide film 4, the P-type silicon 5, the N-type silicon 6, the front silicon nitride film 7 and the front silver electrode 8 are consecutively connected from the bottom up. The P-type silicon 5 is a silicon wafer of the cell. The N-type silicon 6 is an N-type emitter formed by diffusion via the front surface of the silicon wafer. The front silicon nitride film 7 is deposited on the front surface of the silicon wafer, and the rear aluminum oxide film 4 is deposited on the rear surface of the silicon wafer. The rear aluminum oxide film 4 is deposited after the front silicon nitride film 7 is deposited on the silicon wafer. Moreover, the rear surface of the silicon wafer is washed before depositing the rear aluminum oxide film 4.

In the present embodiment, the rear aluminum oxide film 4 is made of alumina ($Al_2O_3$), and the rear silicon nitride film 3 and the front silicon nitride film 7 are made of the same material, both silicon nitride ($Si_3N_4$).

In the present embodiment, the thickness of the front silicon nitride film 7 is 75 μm, the thickness of the rear silicon nitride film 3 is 150 μm, and the thickness of the rear aluminum oxide film 4 is 8 nm. The thickness of the front silicon nitride film 7 may be selected from a range of 50 to 300 microns, preferably 60 to 90 microns. The thickness of the rear silicon nitride film 3 may be selected from a range of 80 to 300 microns, preferably 100 to 200 microns. The thickness of the rear aluminum oxide film 4 may be selected from a range of 2 to 50 nm, for example, 10 nm, 20 nm, 30 nm, 40 nm, and preferably 5 to 30 nm.

Figure 2:
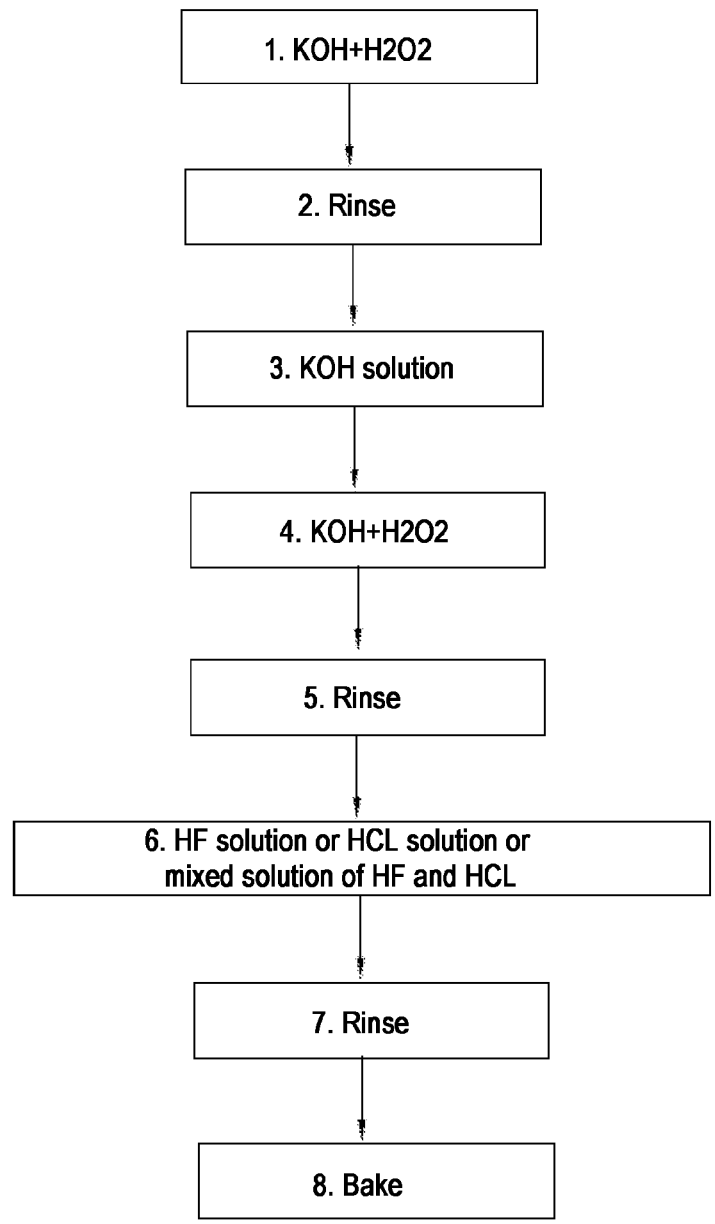
FIG. 2 is a flow block chart of step S105 of a method of preparing a PERC solar cell capable of improving photoelectric conversion efficiency in the present invention.

The method of preparing the PERC solar cell capable of improving photoelectric conversion efficiency described above includes the following steps:

S101: forming a textured surface at a front surface of the silicon wafer, the silicon wafer being the P-type silicon 5;

S102: performing diffusion via the front surface of the silicon wafer to form the N-type silicon 6, i.e., the N-type emitter;

S103: removing p-n junctions at periphery of the silicon wafer and front phosphosilicate glass formed during the diffusion and performing an ozone oxidation treatment on the front surface of the silicon wafer; after the step S103, it is determined whether or not to polish the rear surface of the silicon wafer according to actual conditions;

S104: depositing the front silicon nitride film 7 on the front surface of the silicon wafer;

S105: washing the rear surface of the silicon wafer, as shown in FIG. 2, including specifically the following steps performed sequentially:

S1051: placing the silicon wafer into a mixed solution of KOH and $H_2O_2$ for a period of 300 s, wherein the mass fraction of KOH in the mixed solution is 0.1%, the mass fraction of $H_2O_2$ in the mixed solution is 0.1%, and the temperature of the mixed solution is 99 degree centigrade;

S1052: rinsing the silicon wafer in deionized water for a period of 30 s;

S1053: placing the silicon wafer into a KOH solution for a period of 300 s, wherein the mass fraction of KOH is 0.3%, and the temperature is 99 degree centigrade;

S1054: placing the silicon wafer into a mixed solution of KOH and $H_2O_2$ for a period of 300 s, wherein the mass fraction of KOH in the mixed solution is 0.1, the mass fraction of $H_2O_2$ in the mixed solution is 0.1, and the temperature of the mixed solution is 99 degree centigrade;

S1055: rinsing the silicon wafer in deionized water for a period of 30 s;

S1056: placing the silicon wafer into an HF solution at a temperature of 90 degree centigrade for a period of 300 s, wherein the mass fraction of HF is 0.2%; at this step, the HF solution may be replaced by an HCL solution in which the mass fraction of HCL is 0.2%, or the HF solution may be replaced by a mixed solution of HF and HCL in which the mass fraction of HF is 0.2% and the mass fraction of HCL is 0.2%;

S1057: rinsing the silicon wafer in deionized water at a temperature of 60 degree centigrade for a period of 300 s, wherein after the rinsing is completed, the silicon wafer is pulled out of the water with a slow pulling technique;

S1058: baking the silicon wafer;

S106: depositing the rear aluminum oxide film 4 on the rear surface of the silicon wafer;

S107: depositing the rear silicon nitride film 3 on the rear surface of the silicon wafer;

S108: performing laser grooving in the rear surface of the silicon wafer through the rear silicon nitride film 3 and the rear aluminum oxide film 4 and then to the silicon wafer, to form the plurality of laser grooving regions 9;

S109: printing rear electrode paste on the rear surface of the silicon wafer, and baking the silicon wafer;

S110: printing aluminum paste on the rear surface of the silicon wafer to form the rear aluminum field 2, printing aluminum paste in the laser grooving regions 9 to form the rear aluminum strips 10 while printing the rear aluminum field 2, wherein the rear aluminum strips 10 and the rear aluminum field 2 are molded in an integral printing manner, and baking the silicon wafer after printing;

S111: printing positive electrode paste on the front surface of the silicon wafer, and baking the silicon wafer;

S112: sintering the silicon wafer at a high temperature to form the rear silver electrode 1, the rear aluminum field 2 and the front silver electrode 8;

S113: performing an anti-LID annealing treatment on the silicon wafer to form the solar cell.

In the present embodiment, all of KOH in the step S105 may be replaced with NaOH.

The steps S101-S108 in the present embodiment are not necessarily performed sequentially in order, and those skilled in the art may adjust the order of the steps according to actual conditions.

Embodiment 2

The embodiment 2 of the PERC solar cell capable of improving photoelectric conversion efficiency in the present invention is different from the embodiment 1 in: in embodiment 2, the thickness of the front silicon nitride film 7 is 180 μm, the thickness of the rear silicon nitride film 3 is 200 μm, and the thickness of the rear aluminum oxide film 4 is 9 nm.

The method of preparing the PERC solar cell in the present embodiment includes specifically the following steps:

S101: forming a textured surface at a front surface of the silicon wafer, the silicon wafer being the P-type silicon 5;

S102: performing diffusion via the front surface of the silicon wafer to form the N-type silicon 6, i.e., the N-type emitter;

S103: removing p-n junctions at periphery of the silicon wafer and front phosphosilicate glass formed during the diffusion and performing an ozone oxidation treatment on the front surface of the silicon wafer; after the step S103, it is determined whether or not to polish the rear surface of the silicon wafer according to actual conditions;

S104: depositing the front silicon nitride film 7 on the front surface of the silicon wafer;

S105: washing the rear surface of the silicon wafer, as shown in FIG. 2, including specifically the following steps performed sequentially:

S1051: placing the silicon wafer into a mixed solution of NAOH and $H_2O_2$ for a period of 240 s, wherein the mass fraction of NAOH in the mixed solution is 1.5%, the mass fraction of $H_2O_2$ in the mixed solution is 1.3%, and the temperature of the mixed solution is 90 degree centigrade;

S1052: rinsing the silicon wafer in deionized water for a period of 240 s;

S1053: placing the silicon wafer into an NAOH solution for a period of 240 s, wherein the mass fraction of NAOH is 4.5%, and the temperature is 90 degree centigrade;

S1054: placing the silicon wafer into a mixed solution of NAOH and $H_2O_2$ for a period of 250 s, wherein the mass fraction of NAOH in the mixed solution is 1.5%, the mass fraction of $H_2O_2$ in the mixed solution is 1.3%, and the temperature of the mixed solution is 90 degree centigrade;

S1055: rinsing the silicon wafer in deionized water for a period of 250 s;

S1056: placing the silicon wafer into an HF solution at a temperature of 80 degree centigrade for a period of 240 s, wherein the mass fraction of HF is 1.5%; at this step, the HF solution may be replaced by an HCL solution in which the mass fraction of HCL is 1.2%, or the HF solution may be replaced by a mixed solution of HF and HCL in which the mass fraction of HF is 1.5% and the mass fraction of HCL is 1.2%;

S1057: rinsing the silicon wafer in deionized water at a temperature of 90 degree centigrade for a period of 250 s, wherein after the rinsing is completed, the silicon wafer is pulled out of the water with a slow pulling technique;

S1058: baking the silicon wafer;

S106: depositing the rear aluminum oxide film 4 on the rear surface of the silicon wafer;

S107: depositing the rear silicon nitride film 3 on the rear surface of the silicon wafer;

S108: performing laser grooving in the rear surface of the silicon wafer through the rear silicon nitride film 3 and the rear aluminum oxide film 4 and then to the silicon wafer, to form the plurality of laser grooving regions 9;

S109: printing rear electrode paste on the rear surface of the silicon wafer, and baking the silicon wafer;

S110: printing aluminum paste on the rear surface of the silicon wafer to form the rear aluminum field 2, printing aluminum paste in the laser grooving regions 9 to form the rear aluminum strips 10 while printing the rear aluminum field 2, wherein the rear aluminum strips 10 and the rear aluminum field 2 are molded in an integral printing manner, and baking the silicon wafer after printing;

S111: printing positive electrode paste on the front surface of the silicon wafer, and baking the silicon wafer;

S112: sintering the silicon wafer at a high temperature to form the rear silver electrode 1, the rear aluminum field 2 and the front silver electrode 8;

S113: performing an anti-LID annealing treatment on the silicon wafer to form the solar cell.

In the present embodiment, all of NAOH in the step S105 may be replaced with KOH.

The steps S101-S108 in the present embodiment are not necessarily performed sequentially in order, and those skilled in the art may adjust the order of the steps according to actual conditions.

Embodiment 3

The embodiment 3 of the PERC solar cell capable of improving photoelectric conversion efficiency in the present invention is different from the embodiment 1 in: in embodiment 3, the thickness of the front silicon nitride film 7 is 260 μm, the thickness of the rear silicon nitride film 3 is 250 μm, and the thickness of the rear aluminum oxide film 4 is 16 nm.

The method of preparing the PERC solar cell in the present embodiment includes specifically the following steps:

S101: forming a textured surface at a front surface of the silicon wafer, the silicon wafer being the P-type silicon 5;

S102: performing diffusion via the front surface of the silicon wafer to form the N-type silicon 6, i.e., the N-type emitter;

S103: removing p-n junctions at periphery of the silicon wafer and front phosphosilicate glass formed during the diffusion and performing an ozone oxidation treatment on the front surface of the silicon wafer; after the step S103, it is determined whether or not to polish the rear surface of the silicon wafer according to actual conditions;

S104: depositing the front silicon nitride film 7 on the front surface of the silicon wafer;

S105: washing the rear surface of the silicon wafer, as shown in FIG. 2, including specifically the following steps performed sequentially:

S1051: placing the silicon wafer into a mixed solution of KOH and $H_2O_2$ for a period of 150 s, wherein the mass fraction of KOH in the mixed solution is 3%, the mass fraction of $H_2O_2$ in the mixed solution is 2.5%, and the temperature of the mixed solution is 80 degree centigrade;

S1052: rinsing the silicon wafer in deionized water for a period of 150 s;

S1053: placing the silicon wafer into a KOH solution for a period of 160 s, wherein the mass fraction of KOH is 9%, and the temperature is 80 degree centigrade;

S1054: placing the silicon wafer into a mixed solution of KOH and $H_2O_2$ for a period of 160 s, wherein the mass fraction of KOH in the mixed solution is 3%, the mass fraction of $H_2O_2$ in the mixed solution is 2.5%, and the temperature of the mixed solution is 82 degree centigrade;

S1055: rinsing the silicon wafer in deionized water for a period of 150 s;

S1056: placing the silicon wafer into an HF solution at a temperature of 75 degree centigrade for a period of 150 s, wherein the mass fraction of HF is 3%; at this step, the HF solution may be replaced by an HCL solution in which the mass fraction of HCL is 2.5%, or the HF solution may be replaced by a mixed solution of HF and HCL in which the mass fraction of HF is 3% and the mass fraction of HCL is 2.5%;

S1057: rinsing the silicon wafer in deionized water at a temperature of 80 degree centigrade for a period of 160 s, wherein after the rinsing is completed, the silicon wafer is pulled out of the water with a slow pulling technique;

S1058: baking the silicon wafer;

S106: depositing the rear aluminum oxide film 4 on the rear surface of the silicon wafer;

S107: depositing the rear silicon nitride film 3 on the rear surface of the silicon wafer;

S108: performing laser grooving in the rear surface of the silicon wafer through the rear silicon nitride film 3 and the rear aluminum oxide film 4 and then to the silicon wafer, to form the plurality of laser grooving regions 9;

S109: printing rear electrode paste on the rear surface of the silicon wafer, and baking the silicon wafer;

S110: printing aluminum paste on the rear surface of the silicon wafer to form the rear aluminum field 2, printing aluminum paste in the laser grooving regions 9 to form the rear aluminum strips 10 while printing the rear aluminum field 2, wherein the rear aluminum strips 10 and the rear aluminum field 2 are molded in an integral printing manner, and baking the silicon wafer after printing;

S111: printing positive electrode paste on the front surface of the silicon wafer, and baking the silicon wafer;

S112: sintering the silicon wafer at a high temperature to form the rear silver electrode 1, the rear aluminum field 2 and the front silver electrode 8;

S113: performing an anti-LID annealing treatment on the silicon wafer to form the solar cell.

In the present embodiment, all of KOH in the step S105 may be replaced with NaOH.

The steps S101-S108 in the present embodiment are not necessarily performed sequentially in order, and those skilled in the art may adjust the order of the steps according to actual conditions.

Embodiment 4

The embodiment 4 of the PERC solar cell capable of improving photoelectric conversion efficiency in the present invention is different from the embodiment 1 in: in embodiment 4, the thickness of the front silicon nitride film 7 is 300 μm, the thickness of the rear silicon nitride film 3 is 300 μm, and the thickness of the rear aluminum oxide film 4 is 23 nm.

The method of preparing the PERC solar cell in the present embodiment includes specifically the following steps:

S101: forming a textured surface at a front surface of the silicon wafer, the silicon wafer being the P-type silicon 5;

S102: performing diffusion via the front surface of the silicon wafer to form the N-type silicon 6, i.e., the N-type emitter;

S103: removing p-n junctions at periphery of the silicon wafer and front phosphosilicate glass formed during the diffusion and performing an ozone oxidation treatment on the front surface of the silicon wafer; after the step S103, it is determined whether or not to polish the rear surface of the silicon wafer according to actual conditions;

S104: depositing the front silicon nitride film 7 on the front surface of the silicon wafer;

S105: washing the rear surface of the silicon wafer, as shown in FIG. 2, including specifically the following steps performed sequentially:

S1051: placing the silicon wafer into a mixed solution of NAOH and $H_2O_2$ for a period of 60 s, wherein the mass fraction of NAOH in the mixed solution is 4.5%, the mass fraction of $H_2O_2$ in the mixed solution is 3.8%, and the temperature of the mixed solution is 70 degree centigrade;

S1052: rinsing the silicon wafer in deionized water for a period of 100 s;

S1053: placing the silicon wafer into an NAOH solution for a period of 60 s, wherein the mass fraction of NAOH is 14%, and the temperature is 70 degree centigrade;

S1054: placing the silicon wafer into a mixed solution of NAOH and $H_2O_2$ for a period of 60 s, wherein the mass fraction of NAOH in the mixed solution is 4.5%, the mass fraction of $H_2O_2$ in the mixed solution is 3.8%, and the temperature of the mixed solution is 70 degree centigrade;

S1055: rinsing the silicon wafer in deionized water for a period of 90 s;

S1056: placing the silicon wafer into an HF solution at a temperature of 70 degree centigrade for a period of 40 s, wherein the mass fraction of HF is 4.5%; at this step, the HF solution may be replaced by an HCL solution in which the mass fraction of HCL is 3.8%, or the HF solution may be replaced by a mixed solution of HF and HCL in which the mass fraction of HF is 4.5% and the mass fraction of HCL is 3.8%;

S1057: rinsing the silicon wafer in deionized water at a temperature of 65 degree centigrade for a period of 250 s, wherein after the rinsing is completed, the silicon wafer is pulled out of the water with a slow pulling technique;

S1058: baking the silicon wafer;

S106: depositing the rear aluminum oxide film 4 on the rear surface of the silicon wafer;

S107: depositing the rear silicon nitride film 3 on the rear surface of the silicon wafer;

S108: performing laser grooving in the rear surface of the silicon wafer through the rear silicon nitride film 3 and the rear aluminum oxide film 4 and then to the silicon wafer, to form the plurality of laser grooving regions 9;

S109: printing rear electrode paste on the rear surface of the silicon wafer, and baking the silicon wafer;

S110: printing aluminum paste on the rear surface of the silicon wafer to form the rear aluminum field 2, printing aluminum paste in the laser grooving regions 9 to form the rear aluminum strips 10 while printing the rear aluminum field 2, wherein the rear aluminum strips 10 and the rear aluminum field 2 are molded in an integral printing manner, and baking the silicon wafer after printing;

S111: printing positive electrode paste on the front surface of the silicon wafer, and baking the silicon wafer;

S112: sintering the silicon wafer at a high temperature to form the rear silver electrode 1, the rear aluminum field 2 and the front silver electrode 8;

S113: performing an anti-LID annealing treatment on the silicon wafer to form the solar cell.

In the present embodiment, all of NAOH in the step S105 may be replaced with KOH.

The steps S101-S108 in the present embodiment are not necessarily performed sequentially in order, and those skilled in the art may adjust the order of the steps according to actual conditions.

Embodiment 5

The embodiment 5 of the PERC solar cell capable of improving photoelectric conversion efficiency in the present invention is different from the embodiment 1 in: in embodiment 5, the thickness of the front silicon nitride film 7 is 80 μm, the thickness of the rear silicon nitride film 3 is 80 μm, and the thickness of the rear aluminum oxide film 4 is 30 nm.

The method of preparing the PERC solar cell in the present embodiment includes specifically the following steps:

S101: forming a textured surface at a front surface of the silicon wafer, the silicon wafer being the P-type silicon 5;

S102: performing diffusion via the front surface of the silicon wafer to form the N-type silicon 6, i.e., the N-type emitter;

S103: removing p-n junctions at periphery of the silicon wafer and front phosphosilicate glass formed during the diffusion and performing an ozone oxidation treatment on the front surface of the silicon wafer; after the step S103, it is determined whether or not to polish the rear surface of the silicon wafer according to actual conditions;

S104: depositing the front silicon nitride film 7 on the front surface of the silicon wafer;

S105: washing the rear surface of the silicon wafer, as shown in FIG. 2, including specifically the following steps performed sequentially:

S1051: placing the silicon wafer into a mixed solution of KOH and $H_2O_2$ for a period of 30 s, wherein the mass fraction of KOH in the mixed solution is 6%, the mass fraction of $H_2O_2$ in the mixed solution is 5%, and the temperature of the mixed solution is 60 degree centigrade;

S1052: rinsing the silicon wafer in deionized water for a period of 300 s;

S1053: placing the silicon wafer into a KOH solution for a period of 30 s, wherein the mass fraction of KOH is 18%, and the temperature is 60 degree centigrade;

S1054: placing the silicon wafer into a mixed solution of KOH and $H_2O_2$ for a period of 30 s, wherein the mass fraction of KOH in the mixed solution is 6%, the mass fraction of $H_2O_2$ in the mixed solution is 5%, and the temperature of the mixed solution is 60 degree centigrade;

S1055: rinsing the silicon wafer in deionized water for a period of 300 s;

S1056: placing the silicon wafer into an HF solution at a temperature of 90 degree centigrade for a period of 5 s, wherein the mass fraction of HF is 6%; at this step, the HF solution may be replaced by an HCL solution in which the mass fraction of HCL is 5%, or the HF solution may be replaced by a mixed solution of HF and HCL in which the mass fraction of HF is 6% and the mass fraction of HCL is 5%;

S1057: rinsing the silicon wafer in deionized water at a temperature of 99 degree centigrade for a period of 30 s, wherein after the rinsing is completed, the silicon wafer is pulled out of the water with a slow pulling technique;

S1058: baking the silicon wafer;

S106: depositing the rear aluminum oxide film 4 on the rear surface of the silicon wafer;

S107: depositing the rear silicon nitride film 3 on the rear surface of the silicon wafer;

S108: performing laser grooving in the rear surface of the silicon wafer through the rear silicon nitride film 3 and the rear aluminum oxide film 4 and then to the silicon wafer, to form the plurality of laser grooving regions 9;

S109: printing rear electrode paste on the rear surface of the silicon wafer, and baking the silicon wafer;

S110: printing aluminum paste on the rear surface of the silicon wafer to form the rear aluminum field 2, printing aluminum paste in the laser grooving regions 9 to form the rear aluminum strips 10 while printing the rear aluminum field 2, wherein the rear aluminum strips 10 and the rear aluminum field 2 are molded in an integral printing manner, and baking the silicon wafer after printing;

S111: printing positive electrode paste on the front surface of the silicon wafer, and baking the silicon wafer;

S112: sintering the silicon wafer at a high temperature to form the rear silver electrode 1, the rear aluminum field 2 and the front silver electrode 8;

S113: performing an anti-LID annealing treatment on the silicon wafer to form the solar cell.

In the present embodiment, all of KOH in the step S105 may be replaced with NaOH.

The steps S101-S108 in the present embodiment are not necessarily performed sequentially in order, and those skilled in the art may adjust the order of the steps according to actual conditions.

The above embodiments of the present invention are not intended to limit the protection scope of the present invention, to which the implementations of the present invention are not confined. Many other forms of modifications, substitutions or alternations made to the above structure of the present invention, which are provided on the basis of the above content of the present invention in view of the common technical knowledge and customary means in the art, shall all fall into the protection scope of the present invention, without departing from the basic technical idea as described above of the present invention.

What is claimed is:

1. A preparation method of preparing the PERC solar cell capable of improving photoelectric conversion efficiency, comprising:

forming a textured surface at a front surface of a silicon wafer, the silicon wafer being a P-type silicon;

performing diffusion via the front surface of the silicon wafer to form an N-type emitter of N-type silicon;

removing p-n junctions at a periphery of the silicon wafer and front phosphosilicate glass formed during the diffusion;

performing an ozone oxidation treatment on the front surface of the silicon wafer;

depositing a front silicon nitride film on the front surface of the silicon wafer;

washing a rear surface of the silicon wafer;

depositing a rear aluminum oxide film on the rear surface of the silicon wafer;

depositing a rear silicon nitride film on the rear surface of the silicon wafer;

forming a plurality of laser grooving regions by performing laser grooving in the rear surface of the silicon wafer, through the rear silicon nitride film and the rear aluminum oxide film and then to the silicon wafer;

printing rear electrode paste on the rear surface of the silicon wafer, and baking the silicon wafer;

printing aluminum paste on the rear surface of the silicon wafer to form an rear aluminum field and printing aluminum paste in the laser grooving regions to form rear aluminum strips while printing the rear aluminum field, wherein the rear aluminum strips and the rear aluminum field are molded in an integral printing manner; and baking the silicon wafer after printing;

printing positive electrode paste on the front surface of the silicon wafer, and baking the silicon wafer;

sintering the silicon wafer to form a rear silver electrode, the rear aluminum field and a front silver electrode;

performing an anti-LID annealing treatment on the silicon wafer to form the solar cell;

wherein the washing the rear surface of the silicon wafer includes the following steps:

placing the silicon wafer into a mixed solution of KOH and $H_2O_2$ for a period of 30~300 s, wherein the mass fraction of KOH in the mixed solution is 0.1%~6%, the mass fraction of $H_2O_2$ in the mixed solution is 0.1%~5%, and the temperature of the mixed solution is 60~99 degree centigrade;

rinsing the silicon wafer in deionized water for a period of 30~300 s;

placing the silicon wafer into a KOH solution for a period of 30~300 s, wherein the mass fraction of KOH is 0.3%~18%, and the temperature is 60~99 degree centigrade;

placing the silicon wafer into a mixed solution of KOH and $H_2O_2$ for a period of 30~300 s, wherein the mass fraction of KOH in the mixed solution is 01%~6%, the mass fraction of $H_2O_2$ in the mixed solution is 0.1%~5%, and the temperature of the mixed solution is 60~99 degree centigrade;

rinsing the silicon wafer in deionized water for a period of 30~300 s;

placing the silicon wafer into an HF solution or an HCL solution or a mixed solution of HF and HCL at a temperature of 60~90 degree centigrade for a period of 5~300 s, wherein the mass fraction of HF in the HF solution is 0.2%~6%, the mass fraction of HCL in the HCL solution is 0.2%~5%, and in the mixed solution of HF and HCL, the mass fraction of HF is 0.2%~6% and the mass fraction of HCL is 0.2%~5%;

rinsing the silicon wafer in deionized water at a temperature of 60~99 degree centigrade for a period of 30~300 s, wherein after the rinsing is completed, the silicon wafer is pulled out of the water;

baking the silicon wafer.

2. The preparation method according to claim 1, wherein after the rinsing the silicon wafer in the deionized water is completed, the silicon wafer is pulled out of the deionized water with a slow pulling technique.

3. A preparation method of preparing the PERC solar cell capable of improving photoelectric conversion efficiency, comprising:
    forming a textured surface at a front surface of a silicon wafer, the silicon wafer being a P-type silicon;
    performing diffusion via the front surface of the silicon wafer to form an N-type emitter of N-type silicon;
    removing p-n junctions at a periphery of the silicon wafer and front phosphosilicate glass formed during the diffusion;
    performing an ozone oxidation treatment on the front surface of the silicon wafer;
    depositing a front silicon nitride film on the front surface of the silicon wafer;
    washing a rear surface of the silicon wafer;
    depositing a rear aluminum oxide film on the rear surface of the silicon wafer;
    depositing a rear silicon nitride film on the rear surface of the silicon wafer;
    forming a plurality of laser grooving regions by performing laser grooving in the rear surface of the silicon wafer, through the rear silicon nitride film and the rear aluminum oxide film and then to the silicon wafer;
    printing rear electrode paste on the rear surface of the silicon wafer, and baking the silicon wafer;
    printing aluminum paste on the rear surface of the silicon wafer to form an rear aluminum field and printing aluminum paste in the laser grooving regions to form rear aluminum strips while printing the rear aluminum field, wherein the rear aluminum strips and the rear aluminum field are molded in an integral printing manner; and baking the silicon wafer after printing;
    printing positive electrode paste on the front surface of the silicon wafer;
    sintering the silicon wafer to form a rear silver electrode, the rear aluminum field and a front silver electrode;
    performing an anti-LID annealing treatment on the silicon wafer to form the solar cell;
    wherein the washing the rear surface of the silicon wafer includes the following steps:
        placing the silicon wafer into a mixed solution of NAOH and $H_2O_2$ for a period of 30~300 s, wherein the mass fraction of NAOH in the mixed solution is 0.1%~6%, the mass fraction of $H_2O_2$ in the mixed solution is 0.1%~5%, and the temperature of the mixed solution is 60~99 degree centigrade;
        rinsing the silicon wafer in deionized water for a period of 30~300 s;
        placing the silicon wafer into a NAOH solution for a period of 30~300 s, wherein the mass fraction of NAOH is 0.3%~18%, and the temperature is 60~99 degree centigrade;
        placing the silicon wafer into a mixed solution of NAOH and $H_2O_2$ for a period of 30~300 s, wherein the mass fraction of NAOH in the mixed solution is 01%~6%, the mass fraction of $H_2O_2$ in the mixed solution is 0.1%~5%, and the temperature of the mixed solution is 60~99 degree centigrade;
        rinsing the silicon wafer in deionized water for a period of 30~300 s;
        placing the silicon wafer into an HF solution or an HCL solution or a mixed solution of HF and HCL at a temperature of 60~90 degree centigrade for a period of 5~300 s, wherein the mass fraction of HF in the HF solution is 0.2%~6%, the mass fraction of HCL in the HCL solution is 0.2%~5%, and in the mixed solution of HF and HCL, the mass fraction of HF is 0.2%~6% and the mass fraction of HCL is 0.2%~5%;
        rinsing the silicon wafer in deionized water at a temperature of 60~99 degree centigrade for a period of 30~300 s, wherein after the rinsing is completed, the silicon wafer is pulled out of the water;
        baking the silicon wafer.

\* \* \* \* \*